United States Patent
Tsuruha et al.

(10) Patent No.: US 10,930,822 B2
(45) Date of Patent: *Feb. 23, 2021

(54) METHOD OF MANUFACTURING LIGHT EMITTING DEVICE

(71) Applicant: NICHIA CORPORATION, Anan (JP)

(72) Inventors: Tomoaki Tsuruha, Anan (JP); Noritsugu Uchiwa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/251,862

(22) Filed: Jan. 18, 2019

(65) Prior Publication Data

US 2019/0157518 A1 May 23, 2019

Related U.S. Application Data

(63) Continuation of application No. 15/466,959, filed on Mar. 23, 2017, now Pat. No. 10,224,465.

(30) Foreign Application Priority Data

Mar. 24, 2016 (JP) .................................. 2016-059655

(51) Int. Cl.
 *H01L 33/50* (2010.01)
 *H01L 33/48* (2010.01)
 (Continued)

(52) U.S. Cl.
 CPC .......... *H01L 33/502* (2013.01); *H01L 33/486* (2013.01); *H01L 33/507* (2013.01);
 (Continued)

(58) Field of Classification Search
 CPC ..... H01L 2933/0033; H01L 2933/0041; H01L 2933/005; H01L 33/486; H01L 33/502;
 (Continued)

(56) References Cited

U.S. PATENT DOCUMENTS 4,020,033 A * 4/1977 Dannels ................. C08G 75/14
 524/730
4,292,107 A * 9/1981 Tanaka ................... C09K 11/02
 156/249

(Continued)

FOREIGN PATENT DOCUMENTS

CN 101336258 A * 12/2008
CN 102504640 A * 6/2012

(Continued)

OTHER PUBLICATIONS

Non Final Office Action of the US continuation U.S. Appl. No. 15/466,959, dated Oct. 20, 2017.

(Continued)

*Primary Examiner* — Sophia T Nguyen
(74) *Attorney, Agent, or Firm* — Global IP Counselors, LLP

(57) ABSTRACT

A method of manufacturing a light emitting device includes: providing particles of a fluorescent material; providing a substrate having a light emitting element mounted thereon; providing a first resin solution and a second resin solution that are two components of a two-component type curable resin; mixing the particles of the fluorescent material in the first resin solution to obtain a first suspension; allowing the first suspension to stand; mixing the second resin solution with the first suspension to obtain a second suspension after the allowing of the first suspension to stand; and applying the second suspension on the light emitting element and curing the second suspension to obtain a sealing member.

9 Claims, 4 Drawing Sheets

(51) Int. Cl.
*H01L 33/56* (2010.01)
*H01L 33/54* (2010.01)

(52) U.S. Cl.
CPC .............. *H01L 33/54* (2013.01); *H01L 33/56* (2013.01); *H01L 33/501* (2013.01); *H01L 2224/48091* (2013.01); *H01L 2224/48247* (2013.01); *H01L 2224/48257* (2013.01); *H01L 2224/48465* (2013.01); *H01L 2224/96* (2013.01); *H01L 2924/181* (2013.01); *H01L 2933/005* (2013.01); *H01L 2933/0033* (2013.01); *H01L 2933/0041* (2013.01)

(58) Field of Classification Search
CPC ....... H01L 33/507; H01L 33/54; H01L 33/56; H01L 33/58; H01L 33/641; H01L 33/0095; H01L 33/64; H01L 33/52; H01L 33/44; H01L 33/50; H01L 33/508; H01L 33/465; H01L 21/568; H01L 25/0753; C09K 11/02; H05B 33/10; C09D 5/4476; C08F 2/04; C08F 2/18; C08G 85/00
See application file for complete search history.

(56) References Cited

U.S. PATENT DOCUMENTS

| | | | | |
|---|---|---|---|---|
| 4,503,200 A * | 3/1985 | Corley | C08F 283/10 | 525/529 |
| 4,652,395 A * | 3/1987 | Marcina | C08J 3/226 | 250/302 |
| 4,717,440 A * | 1/1988 | Drain | C08G 59/68 | 156/307.3 |
| 4,756,787 A * | 7/1988 | Drain | C08G 59/68 | 156/307.3 |
| 4,786,660 A * | 11/1988 | Ittmann | C08K 5/17 | 427/385.5 |
| 4,822,849 A * | 4/1989 | Vanderlaan | C08G 18/68 | 473/118 |
| 4,880,869 A * | 11/1989 | Aoki | C07D 205/08 | 524/773 |
| 5,032,432 A * | 7/1991 | Huynh-Tran | C08K 5/1539 | 427/386 |
| 5,053,476 A * | 10/1991 | Akutagawa | C08G 59/42 | 523/440 |
| 5,075,356 A * | 12/1991 | Crosby | C08G 59/226 | 523/428 |
| 5,109,054 A * | 4/1992 | Smith | C08J 3/03 | 524/514 |
| 5,198,299 A * | 3/1993 | Kato | C09D 4/06 | 428/340 |
| 5,308,600 A * | 5/1994 | Von Plessen | C01B 17/90 | 208/13 |
| 5,346,937 A * | 9/1994 | Kuchler | C08G 12/34 | 524/47 |
| 5,399,596 A * | 3/1995 | Kouge | C08F 2/50 | 522/31 |
| 5,399,604 A * | 3/1995 | Sano | C08F 220/04 | 524/356 |
| 5,532,141 A * | 7/1996 | Holler | C07H 15/10 | 424/520 |
| 6,077,883 A * | 6/2000 | Taylor | C03C 25/26 | 523/217 |
| 6,376,638 B1 * | 4/2002 | Lee | C08G 59/686 | 252/182.15 |
| 8,753,719 B1 * | 6/2014 | Ilfrey | C04B 41/71 | 427/280 |
| 9,490,398 B2 * | 11/2016 | Oyamada | H01L 33/50 | |
| 9,777,213 B2 | 10/2017 | Hong et al. | | |
| 9,871,172 B2 * | 1/2018 | Kim | H01L 33/0095 | |
| 10,317,796 B2 * | 6/2019 | Higuchi | G03F 7/004 | |
| 2002/0158565 A1 | 10/2002 | Setlur et al. | | |
| 2002/0163302 A1 * | 11/2002 | Nitta | H01L 33/56 | 313/512 |
| 2003/0083443 A1 * | 5/2003 | Santobianco | C08F 283/00 | 525/530 |
| 2003/0108944 A1 * | 6/2003 | Haaf | C07F 9/3229 | 435/7.1 |
| 2003/0149083 A1 * | 8/2003 | Tanaka | C07C 235/74 | 514/357 |
| 2004/0147711 A1 * | 7/2004 | Christiansen | C08G 59/30 | 528/91 |
| 2004/0185263 A1 * | 9/2004 | Sormani | C08G 65/34 | 428/422.8 |
| 2004/0191418 A1 * | 9/2004 | Suwama | C08G 18/4283 | 427/372.2 |
| 2005/0070674 A1 * | 3/2005 | Rodrigues | C09D 175/04 | 525/523 |
| 2005/0253114 A1 | 11/2005 | Setlur et al. | | |
| 2006/0051606 A1 * | 3/2006 | Decher | C08L 61/28 | 428/526 |
| 2006/0169998 A1 | 8/2006 | Radkov et al. | | |
| 2006/0189704 A1 * | 8/2006 | Dexheimer | C08G 18/4833 | 521/99 |
| 2006/0247179 A1 * | 11/2006 | Fushimi | C07H 15/203 | 514/23 |
| 2007/0090381 A1 * | 4/2007 | Otsuka | C09K 11/64 | 257/98 |
| 2007/0126356 A1 * | 6/2007 | Tanda | H01L 33/486 | 313/512 |
| 2007/0191512 A1 * | 8/2007 | Bigorra Llosas | C08G 59/182 | 523/402 |
| 2007/0259206 A1 | 11/2007 | Oshio | | |
| 2007/0298178 A1 * | 12/2007 | Tanabe | C08F 220/08 | 427/372.2 |
| 2008/0090179 A1 * | 4/2008 | Takeda | G03F 7/0397 | 430/286.1 |
| 2008/0231170 A1 * | 9/2008 | Masato | C09K 11/565 | 313/501 |
| 2009/0156750 A1 * | 6/2009 | Jansen | C08K 5/07 | 525/329.5 |
| 2009/0270394 A1 * | 10/2009 | Galemmo, Jr. | C07C 237/24 | 514/235.5 |
| 2010/0029057 A1 * | 2/2010 | Iwasawa | C08G 77/06 | 438/400 |
| 2010/0029859 A1 * | 2/2010 | Jansen | C08F 299/02 | 525/360 |
| 2010/0033074 A1 * | 2/2010 | Nakakawaji | C09K 11/7734 | 313/483 |
| 2010/0075163 A1 * | 3/2010 | Bhattacharya | C09D 129/14 | 428/461 |
| 2010/0093598 A1 * | 4/2010 | Davio | D06M 15/643 | 510/468 |
| 2010/0109037 A1 * | 5/2010 | Sakurai | H01L 33/504 | 257/98 |
| 2010/0123386 A1 | 5/2010 | Chen | | |
| 2010/0164365 A1 | 7/2010 | Yoshino et al. | | |
| 2010/0183862 A1 * | 7/2010 | Yokoe | C08G 59/504 | 428/300.1 |
| 2010/0207521 A1 * | 8/2010 | Tamaki | H01L 33/504 | 313/506 |
| 2010/0214763 A1 * | 8/2010 | Katou | C09K 11/7734 | 362/84 |
| 2010/0237361 A1 | 9/2010 | Sakai et al. | | |
| 2010/0253213 A1 * | 10/2010 | Tamatani | C07C 243/40 | 313/504 |
| 2010/0320479 A1 * | 12/2010 | Minato | H01L 33/62 | 257/88 |
| 2011/0018026 A1 | 1/2011 | Konno et al. | | |
| 2011/0079816 A1 * | 4/2011 | Fujioka | H01L 23/296 | 257/100 |
| 2012/0077903 A1 * | 3/2012 | Yamagami | C08G 59/66 | 523/400 |
| 2012/0126282 A1 | 5/2012 | Tanikawa et al. | | |
| 2012/0146232 A1 * | 6/2012 | Umemura | H01L 23/3735 | 257/773 |
| 2012/0168219 A1 * | 7/2012 | Kitamura | H01L 23/3135 | 174/263 |
| 2012/0202409 A1 * | 8/2012 | Shinchi | B24B 37/24 | 451/526 |

(56) References Cited

U.S. PATENT DOCUMENTS

| | | | |
|---|---|---|---|
| 2012/0225212 A1* | 9/2012 | Hearn | C08G 65/223 427/386 |
| 2013/0098676 A1* | 4/2013 | Pauze | H05K 5/069 174/520 |
| 2013/0168717 A1* | 7/2013 | Kono | C09K 11/02 257/98 |
| 2013/0234187 A1* | 9/2013 | Ebe | B32B 27/08 257/98 |
| 2013/0240915 A1 | 9/2013 | Nakagawa et al. | |
| 2013/0256715 A1 | 10/2013 | Itoh et al. | |
| 2013/0316120 A1* | 11/2013 | Anderson | B64F 5/10 428/63 |
| 2013/0328091 A1 | 12/2013 | Fuke et al. | |
| 2014/0024796 A1* | 1/2014 | Mizunashi | G02B 1/041 528/31 |
| 2014/0110055 A1* | 4/2014 | Petway | C08G 59/50 156/314 |
| 2014/0175488 A1* | 6/2014 | Kashiwagi | H01L 33/501 257/98 |
| 2014/0191263 A1* | 7/2014 | Wang | C08L 67/02 257/98 |
| 2014/0193630 A1* | 7/2014 | Lewis | B05C 17/00553 428/220 |
| 2014/0232041 A1* | 8/2014 | Han | C08K 5/521 264/300 |
| 2014/0232257 A1 | 8/2014 | Watanabe | |
| 2014/0285997 A1 | 9/2014 | Nitta et al. | |
| 2015/0021643 A1 | 1/2015 | Kurino et al. | |
| 2015/0041845 A1* | 2/2015 | Schwarz | H01L 33/62 257/99 |
| 2015/0055060 A1 | 2/2015 | Yoshida | |
| 2015/0060312 A1* | 3/2015 | Buergel | C04B 26/02 206/219 |
| 2015/0080501 A1* | 3/2015 | Khalyavina | C08K 5/07 524/5 |
| 2015/0140700 A1* | 5/2015 | Sato | H01L 33/502 438/27 |
| 2015/0166885 A1* | 6/2015 | Deshpande | C09K 11/02 313/512 |
| 2015/0171287 A1 | 6/2015 | Matsumura et al. | |
| 2015/0232253 A1* | 8/2015 | Pfeil | C04B 40/0666 206/568 |
| 2015/0232595 A1* | 8/2015 | Leitner | C08F 220/18 524/558 |
| 2015/0232719 A1* | 8/2015 | Pfeil | C09J 163/00 523/457 |
| 2015/0240155 A1 | 8/2015 | Sadakuni et al. | |
| 2015/0252124 A1* | 9/2015 | Gaefke | C04B 28/02 523/401 |
| 2015/0263245 A1 | 9/2015 | Akagawa et al. | |
| 2015/0315400 A1* | 11/2015 | Yano | A43B 9/12 524/113 |
| 2015/0333227 A1* | 11/2015 | Lee | H01L 33/486 257/98 |
| 2015/0336056 A1* | 11/2015 | Ouchi | B01D 63/10 422/211 |
| 2015/0337181 A1* | 11/2015 | Kruger | C08G 18/831 525/524 |
| 2015/0344406 A1* | 12/2015 | Kasemi | C07C 209/24 528/103 |
| 2016/0016192 A1* | 1/2016 | Yang | H01L 33/0095 438/29 |
| 2016/0046753 A1* | 2/2016 | Hsieh | C08G 8/28 525/481 |
| 2016/0072026 A1 | 3/2016 | Kanaumi | |
| 2016/0197247 A1 | 7/2016 | Kanaumi et al. | |
| 2016/0208041 A1* | 7/2016 | Amici-Kroutilova | C08G 18/283 |
| 2016/0266262 A1 | 9/2016 | Fukuda et al. | |
| 2016/0272750 A1* | 9/2016 | Voci | C08G 18/12 |
| 2016/0276549 A1 | 9/2016 | Yamashita et al. | |
| 2016/0322542 A1 | 11/2016 | Akagawa et al. | |
| 2016/0347997 A1* | 12/2016 | Tchoul | C08L 83/14 |
| 2017/0005238 A1* | 1/2017 | Hung | H01L 33/50 |
| 2017/0045452 A1* | 2/2017 | Takahashi | G01N 21/6428 |
| 2017/0051100 A1* | 2/2017 | Petway | C08G 59/54 |
| 2017/0096538 A1 | 4/2017 | Sasaki et al. | |
| 2017/0148966 A1* | 5/2017 | Schwarz | H01L 33/0095 |
| 2017/0152367 A1* | 6/2017 | Han | C08K 5/521 |
| 2017/0159910 A1* | 6/2017 | Seo | G02B 6/0001 |
| 2017/0162759 A1 | 6/2017 | Yamashita et al. | |
| 2017/0162766 A1 | 6/2017 | Sato | |
| 2017/0244011 A1* | 8/2017 | Schlosser | H01L 33/486 |
| 2017/0279010 A1 | 9/2017 | Tsuruha et al. | |
| 2017/0283695 A1 | 10/2017 | Yoshida et al. | |
| 2017/0369373 A1* | 12/2017 | Pfeil | C04B 24/2641 |
| 2018/0006196 A1* | 1/2018 | Linkov | H01L 33/508 |
| 2018/0040779 A1* | 2/2018 | Baek | H01L 33/54 |
| 2018/0051128 A1* | 2/2018 | Iwaya | C08L 63/00 |
| 2018/0057645 A1* | 3/2018 | Oka | C08J 5/042 |
| 2018/0083183 A1* | 3/2018 | Bella | C04B 35/495 |
| 2018/0105720 A1* | 4/2018 | Yamazaki | C09D 7/40 |
| 2018/0183383 A1* | 6/2018 | Lomasney | E04C 2/523 |
| 2018/0208838 A1* | 7/2018 | Sakaino | H01L 33/502 |
| 2018/0230172 A1* | 8/2018 | Furukawa | C08K 9/06 |
| 2018/0292750 A1* | 10/2018 | Lee | G03F 7/038 |
| 2019/0023613 A1* | 1/2019 | Jimenez | C04B 28/06 |
| 2019/0031814 A1* | 1/2019 | Hegedus | C09D 5/08 |
| 2019/0040287 A1* | 2/2019 | Loy | C09B 57/02 |
| 2019/0099995 A1* | 4/2019 | Iihara | B41C 1/1016 |
| 2019/0241782 A1* | 8/2019 | Zook | C09J 181/04 |
| 2019/0377290 A1* | 12/2019 | Kitano | G03G 15/2057 |
| 2020/0006608 A1* | 1/2020 | Ozeki | H01L 33/486 |
| 2020/0071580 A1* | 3/2020 | Ogawa | C09J 183/12 |
| 2020/0087514 A1* | 3/2020 | Fukui | C08K 5/14 |
| 2020/0164613 A1* | 5/2020 | Fukui | C08G 77/12 |
| 2020/0172679 A1* | 6/2020 | Fu | C08G 77/52 |
| 2020/0216671 A1* | 7/2020 | Matsuzaki | H01L 33/502 |

FOREIGN PATENT DOCUMENTS

| | | | |
|---|---|---|---|
| CN | 103232802 A | * | 8/2013 |
| CN | 103289547 B | * | 5/2016 |
| CN | 109181478 A | * | 1/2019 |
| JP | 2006-321966 A | | 11/2006 |
| JP | 2007-157798 A | | 6/2007 |
| JP | 2008-088399 A | | 4/2008 |
| JP | 2009-280763 A | | 12/2009 |
| JP | 2014-056896 A | | 3/2014 |
| JP | 2014-165225 A | | 9/2014 |
| JP | 2015-042705 A | | 3/2015 |
| JP | 2015-063619 A | | 4/2015 |
| WO | 2011-125463 A1 | | 10/2011 |
| WO | 2015-068513 A1 | | 5/2015 |

OTHER PUBLICATIONS

Final Office Action of the US continuation U.S. Appl. No. 15/466,959, dated May 14, 2018.

Advisory Action of the US continuation U.S. Appl. No. 15/466,959, dated Sep. 11, 2018.

Notice of Allowance of the US continuation U.S. Appl. No. 15/466,959, dated Oct. 25, 2018.

* cited by examiner

METHOD OF MANUFACTURING LIGHT EMITTING DEVICE

CROSS-REFERENCE TO RELATED PATENT APPLICATION

This application is a continuation application of U.S. patent application Ser. No. 15/466,959 filed on Mar. 23, 2017. The present application claims priority to Japanese Patent Application No. 2016-059655, filed on Mar. 24, 2016. The entire disclosures of U.S. patent application Ser. No. 15/466,959 and Japanese Patent Application No. 2016-059655 are hereby incorporated herein by reference.

BACKGROUND

1. Technical Field

The present disclosure is related to a method of manufacturing a light emitting device.

2. Description of Related Art

The light emitting devices such as a light emitting diode (LED) employing a semiconductor light emitting element (hereinafter may also be referred to as "light emitting element") include those provided with a fluorescent material to convert light emitted from the light emitting element to light of different wavelength.

In manufacturing such light emitting devices, a liquid preparation of a mixture of particles of a fluorescent material and a liquid resin may be disposed on a light emitting element by potting and cured. For the resin, a two-component type curable resin composition using a main agent and a curing agent (such as described in Japanese Unexamined Patent Application Publication No. 2015-63619, Japanese Unexamined Patent Application Publication No. 2014-56896, etc.) may be employed.

SUMMARY

However, obtaining of a homogeneous mixture may depend on the type and/or the mixing ratio of the liquid resin and the fluorescent material. This can result in unevenness in the emission color of the light emitting device.

A method of manufacturing a light emitting device according to one embodiment of the present disclosure includes: providing particles of a fluorescent material; providing a substrate having a light emitting element mounted thereon; providing a first resin solution and a second resin solution that are two components of a two-component type curable resin; mixing the particles of the fluorescent material in the first resin solution to obtain a first suspension; allowing the first suspension to stand; mixing the second resin solution to the first suspension to obtain a second suspension after the allowing to stand the first suspension; and applying the second suspension on the light emitting element and curing the second suspension to obtain a sealing member.

According to the method described above, the fluorescent material can be mixed substantially uniformly, thereby preventing unevenness in the emission color of a light emitting device.

DETAILED DESCRIPTION OF EMBODIMENTS

Figure 1A:
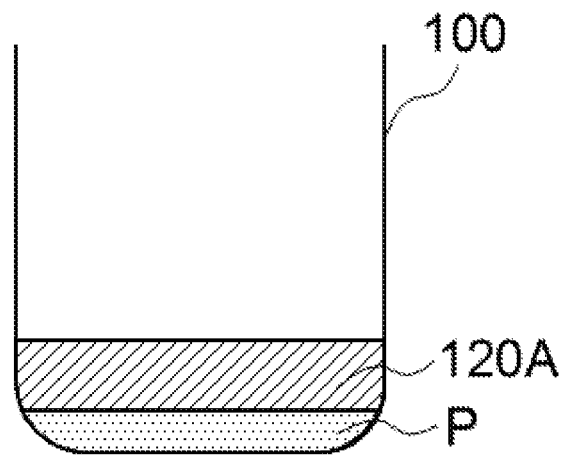
FIGS. 1A to 1D are schematic cross-sectional views illustrative of a method of manufacturing a light emitting device of one embodiment of the present invention.

Preferred embodiments of the present invention will be described below with reference to the accompanying drawings. The preferred embodiments are intended as illustrative of a light emitting device and a method of manufacturing the light emitting device to give a concrete form to technical ideas of the present invention, and the scope of the invention is not limited to those described below.

A method of manufacturing a light emitting device according to certain embodiments of the present invention includes, providing particles of a fluorescent material, providing a substrate having a light emitting element mounted thereon, providing a first resin solution and a second resin solution that are two components of a two-component type curable resin, mixing the fluorescent material in the first resin solution to obtain a first suspension, mixing the second resin solution to the first suspension to obtain a second suspension, and applying the second suspension on the light emitting element and curing the second suspension to obtain a sealing member.

The respective steps will be described below.

Providing Fluorescent Material

Particles of a fluorescent material are provided. The fluorescent material is provided in particles with an average particle size in a range of, for example, about 3 μm to about 30 μm, and the shapes of the particles are approximately spherical or irregular. The average particle size can be represented by $D_{50}$. The average particle size of the fluorescent material can be measured by using, for example, a laser diffraction scattering method or an image analysis method (i.e., a scanning electron microscopy (SEM), a transmission electron microscopy (TEM)). Measuring of particle size with a laser diffraction scattering method can be carried out by using, for example, a SALD Series particle size analyzer (for example, SALD-3100) manufactured by Shimadzu Corporation. An image analysis method may be performed in compliance with JIS Z8827-1:2008.

Examples of such a fluorescent material include an oxide-based fluorescent material, a sulfide-based fluorescent material, and a nitride-based fluorescent material. For example, in the case where a gallium nitride based light emitting element to emit blue light is used as the light emitting element, fluorescent materials that can absorb blue light and emit light of different color may be employed. Specific examples thereof include, YAG-based fluorescent materials and LAG-based fluorescent materials to emit yellow to green light, and SiAlON-based fluorescent materials (β-sialon-based fluorescent materials) and SGS-based fluorescent materials to emit green light, and SCASN-based fluorescent materials and CASN-based fluorescent materials, manganese-activated potassium fluosilicate-based fluorescent materials (KSF-based fluorescent materials: $K_2SiF_6$:Mn), sulfide-based fluorescent materials to emit red light, and those fluorescent materials are used singly or in combination.

Providing Substrate Having Light Emitting Element Mounted Thereon

Figure 2A:
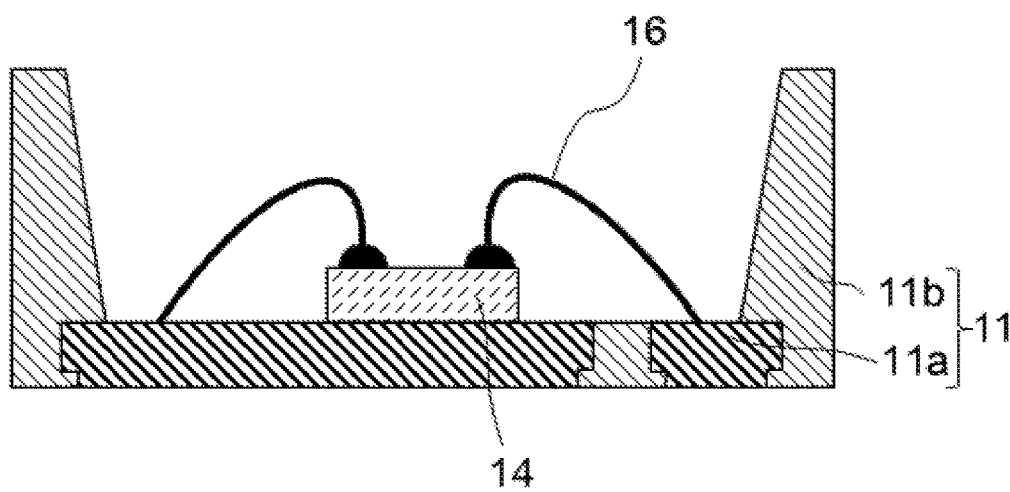
FIGS. 2A to 2C are schematic cross-sectional views illustrative of a method of manufacturing a light emitting device of one embodiment of the present invention.

A substrate 11 having a light emitting element 14 mounted thereon, as illustrated in FIG. 2A, is provided. In this step, a commercially available substrate having a plurality of light emitting elements mounted thereon may be provided, or a substrate having a plurality of light emitting elements mounted thereon may be provided through separately providing a substrate and a plurality of light emitting elements and mounting the plurality of light emitting elements on the substrate. Note that, for example, in the description given with reference to FIG. 2A, a substrate having a single light emitting element mounted thereon is illustrated, but in typical manufacturing, a plurality of light emitting elements is mounted on a single substrate. In other words, a plurality of light emitting devices is collectively fabricated on a single substrate, and through singulating, such a collective of the light emitting devices are cut into individual light emitting devices.

The light emitting element 14 includes a semiconductor layer and electrodes. The semiconductor layer includes, for example, a p-type semiconductor layer, a light emitting layer, and an n-type semiconductor layer. The light emitting element 14 may further include an element substrate. Further, positive and negative electrodes are provided.

For the semiconductor layer, nitride-based compound semiconductors such as $In_XAl_YGa_{1-X-Y}N$ ($0 \leq X$, $0 \leq Y$, $X+Y<1$) can be suitably used. Those nitride-based semiconductor layers may respectively have a single-layer structure, or a layered structure made of layers of different compositions and thickness, or a superlattice structure. Particularly, it is preferable that the light emitting layer has a single quantum well structure or a multiquantum well structure, in which thin layers each can produce quantum effect are layered.

The positive and negative electrodes of the light emitting element are arranged at a same surface side of the semiconductor layer. The positive and negative electrodes may have either a single layer structure or a layered structure, configured to be ohmically connected (that is, linear or approximately linear current-voltage characteristics is exhibited), to the p-type semiconductor layer and the n-type semiconductor layer respectively.

The substrate 11 is a member on which the light emitting element 14 can be mounted, and which can serve as a base when a sealing member to be described further below is disposed. For the substrate, either a member configured to serve as a part of the light emitting device, or a member that to be removed after disposing the sealing member can be used.

Figure 2B:
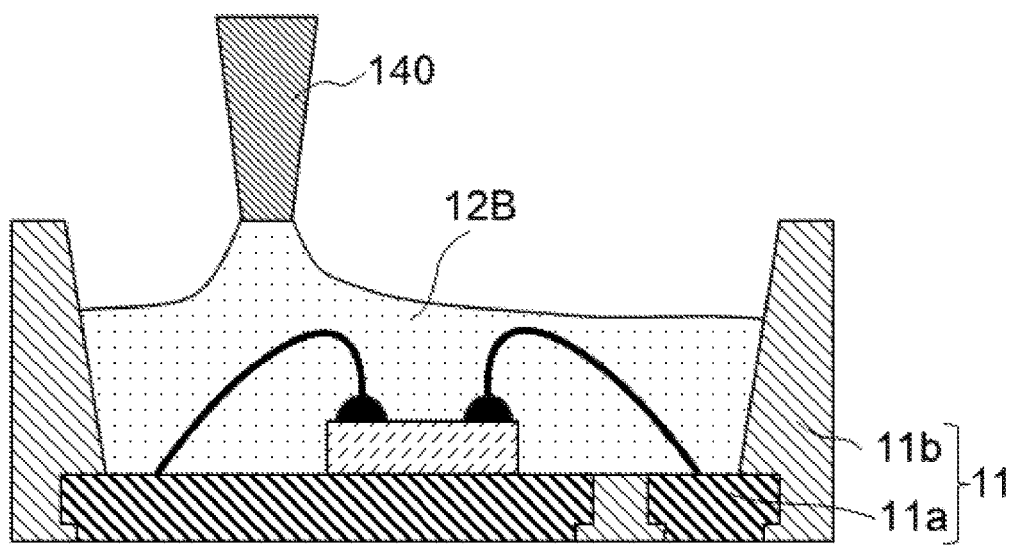
Figure 2C:
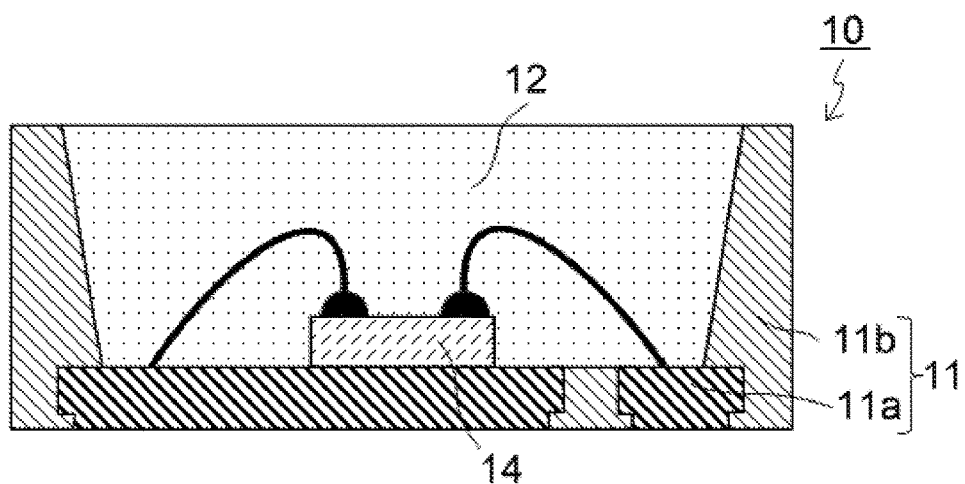

For the substrate configured to serve as a part of the light emitting device, for example as shown in FIG. 2A to 2C, a substrate 11 provided with a recess to mount the light emitting element 14 therein can be employed. The substrate 11 includes an insulating base member 11b and electrically conductive portions 11a configured to serve as the electrodes. For the base member, a resin, ceramic, glass epoxy resin, or the like, can be used. When a resin is used for the base member, the substrate may be a resin package molded integrally with the leads so that portions of the leads are contained in the resin package. When the base member is made of ceramic, the substrate may be a ceramic package of a calcined product of layered material of green sheets and metal thin films. Such a substrate may have a flat-plate-like shape or a shape provided with a recess to mount the light emitting element therein.

Figure 3A:
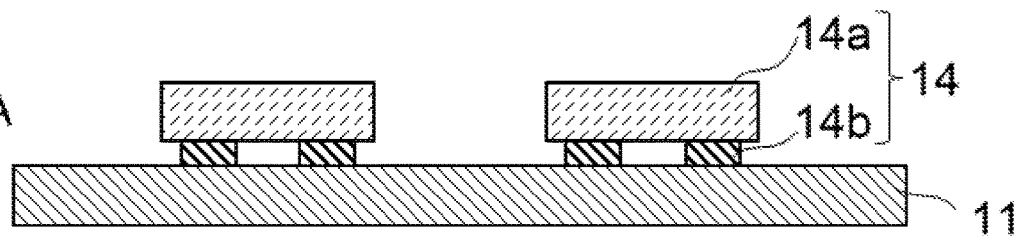
FIGS. 3A to 3E are schematic cross-sectional views illustrative of a method of manufacturing a light emitting device of one embodiment of the present invention.
Figure 3B:
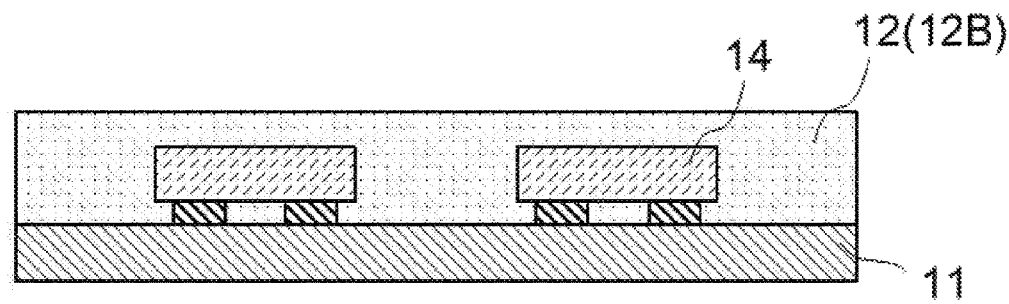
Figure 3C:
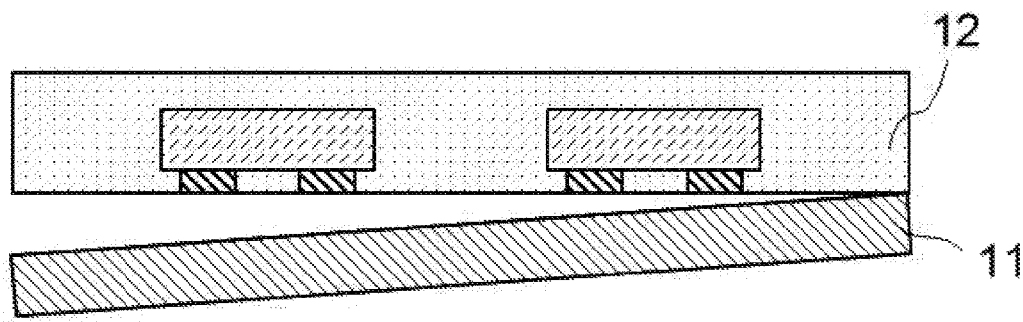

For the substrate, a substrate that to be removed after disposing the sealing member, that is, a substrate used only in the manufacturing can also be used. For example, as shown in FIG. 3A, the substrate 11 having a flat plate-like shape (or a sheet-like shape) can be used. The substrate 11 can be any member on which the light emitting element 14 can be mounted, as shown in FIG. 3A. Also, the substrate 11 can be made of an appropriate material on which the second mixture solution 12b can be disposed, and can be resistant to heating temperature applied during curing the second mixture solution to form the sealing member 12, as shown in FIG. 3B. Further, in this case, the substrate 11 is removed from the sealing member 12 and the light emitting elements 14 as shown in FIG. 3C, so that the substrate 11 is preferably a member that can be easily removed. Removing of the substrate 11 can be carried out by, for example, mechanical peeling or dissolving in a solvent. For such a substrate 11, ceramics or the like can be employed.

Providing the substrate and the light emitting elements as described above and mounting the light emitting elements on the substrate with the use of a bonding member, the substrate having the light emitting elements mounted thereon can be provided. For the bonding member, an electrically conductive joining member or an electrically insulating joining member can be used. Also, the light emitting elements can be mounted either in a face-up manner or in a flip-chip manner. When the substrate has adhesive characteristics (for example, a wafer sheet), a separate joining member is not needed. When a face-up mounting is employed, the electrically conductive members of the substrate and the electrodes of each of the light emitting elements may be electrically connected via wires, respectively.

Providing First Resin Solution and Second Resin Solution

A first resin solution and a second resin solution that are components of two-component type curable resin composition are provided. When mixed, the first resin solution and the second resin solution chemically react to form a cured product.

The first resin solution is a main agent of the two-component type curable resin and has light-transmissive properties and light-resisting properties. Specific examples of the resin used for the first resin solution include a silicone resin, a modified silicone resin, an epoxy resin, a modified epoxy resin, and an acrylic resin. The examples also include a silicone resin, an epoxy resin, a urea resin, a fluororesin, and a hybrid resin that contains at least one of those resins.

The second resin solution contains a curing agent of the two-component type curable resin. Specific examples of the resin used for the second resin solution include a silicone resin, a modified silicone resin, an epoxy resin, a modified epoxy resin, and an acrylic resin. The examples also include a silicone resin, an epoxy resin, a urea resin, a fluororesin, and a hybrid resin that contains at least one of those resins.

Providing First Suspension

The first resin solution and particles of a fluorescent material are mixed to provide a first suspension. The fluorescent material can be mixed in a range of about 10 mass % to about 80 mass % with respect to the first suspension.

As shown in FIG. 1A, the first resin solution 120A and the fluorescent material particles P are placed in a mixing vessel 100 equipped with an agitator and are agitated. At this time, the first resin solution 120A may be placed in the mixing vessel 100 and feeding the fluorescent material particles P into the mixing vessel 100 while agitating the first resin solution 120A, or both the first resin solution 120A and the fluorescent material particles may be placed in the mixing vessel 100 and then agitated. In addition to the fluorescent material particles P, a light diffusing material or the like may be mixed.

The agitation is preferably carried out at a temperature in a range of about 20° C., to about 50° C. The agitation may be carried out by centrifugal agitation, vacuum centrifugal agitation, manual agitation, etc. When centrifugal agitation is employed, for example, a rotation speed in a range of 400 rpm to 1200 rpm with respect to about 150 ml of the first suspension may be applied. The agitating time in a range of 1 minute to 20 minutes may be applied.

Figure 1B:
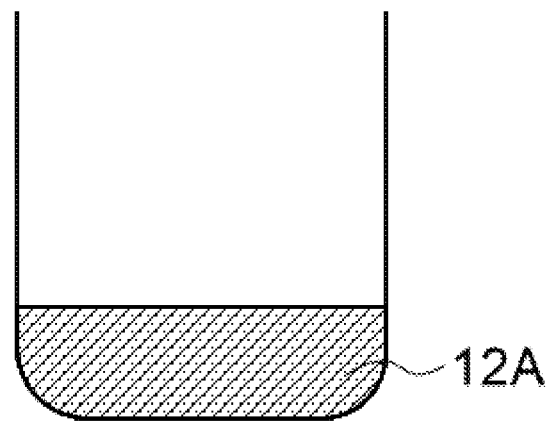

The first suspension 12A obtained by the agitation contains the fluorescent material dispersed in the first resin solution, as shown in FIG. 1B. The first suspension 12A is then allowed to stand for 12 hours to 36 hours, at an appropriate temperature between about 10° C. and about 30° C. The first suspension 12A may be allowed to stand in the mixing vessel or in another vessel. The length of time of the standing can be appropriately determined according to the composition, quantity of the resin, the ratio of the fluorescent material, or the like.

Mixing of the fluorescent material only in the first resin solution can facilitate uniform mixing of the fluorescent material in the entire resin. This is considered as below. When the first resin solution and the second solution are mixed before mixing the fluorescent material, curing reaction may be initiated in a portion of the mixed resin that may create a portion of different characteristics to which a uniform mixing of the fluorescent material may be difficult to obtain. However, when the fluorescent material is mixed only in the first resin solution, in other words, when the fluorescent material is mixed in a uniform resin, uniform dispersion of the fluorescent material in the first resin solution can be obtained, which in turn can facilitate uniform mixing of the fluorescent material in the entire resin.

Providing Second Suspension

The first suspension and the second resin solution are mixed to obtain a second suspension.

Figure 1C:
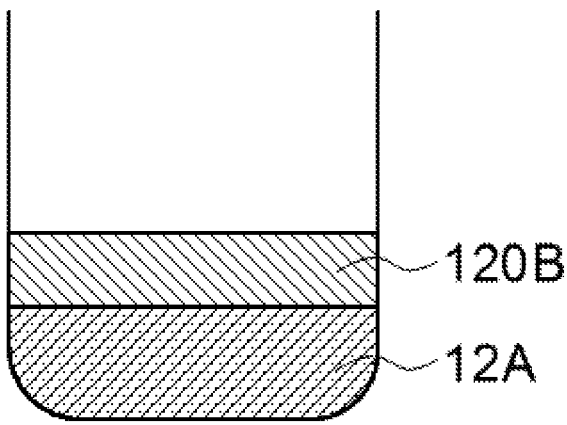
Figure 1D:
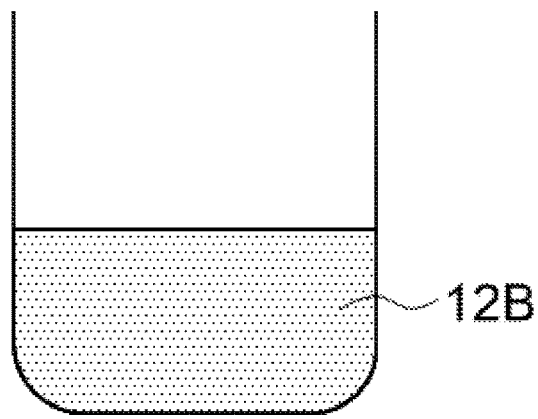

As shown in FIG. 1C, the second resin solution 120B is placed in the mixing vessel 100 that contains the first suspension 12A. The second resin solution 120B may be placed while agitating the first suspension 12A, or the second solution 120B may be placed in the first suspension 12A then start agitating.

The agitation is preferably carried out at a temperature in a range of about 20° C., to about 50° C. The agitation may be carried out by centrifugal agitation, vacuum centrifugal agitation, manual agitation, etc. Mixing of the first resin solution and the second resin solution initiates a chemical reaction, so that the agitation time of the second suspension is preferably shorter than the agitation time of the first suspension. When centrifugal agitation is employed, for example, a rotation speed in a range of 400 rpm to 1200 rpm with respect to about 250 ml of the second suspension may be applied. The agitation time in a range of 1 minute to 20 minutes may be applied. The second suspension 12B thus obtained is transferred from the mixing vessel to a dispenser of a molding machine.

Disposing Second Suspension to Cover Light Emitting Element and Curing Second Suspension As shown in FIG. 2B, a nozzle 140 of a dispenser is positioned over the light emitting element 14 mounted on the substrate 11, and the second suspension 12B is discharged through the nozzle 140 to carry out potting. The amount of the second suspension 12B applied by the potting is sufficient to enclose the entire of the light emitting element 14, and when a wire is employed, to also enclose the wire.

In the case shown in FIG. 2B, a recess is defined in the substrate 11, so that the substrate member 128 is applied by potting in the recess. But in the case as shown in FIG. 3B, when the substrate 11 is not provided with a recess, the second suspension 12B can be disposed by printing, compression molding, transfer molding, or the like.

Subsequently, the second suspension 12B is cured by heating. Thus, a sealing member 12 covering the light emitting element 14 mounted on the substrate 11 can be obtained. The substrate 11 will be cut to be singulated into a plurality of light emitting devices 10 in which variation in the chromaticity is reduced.

Figure 3D:
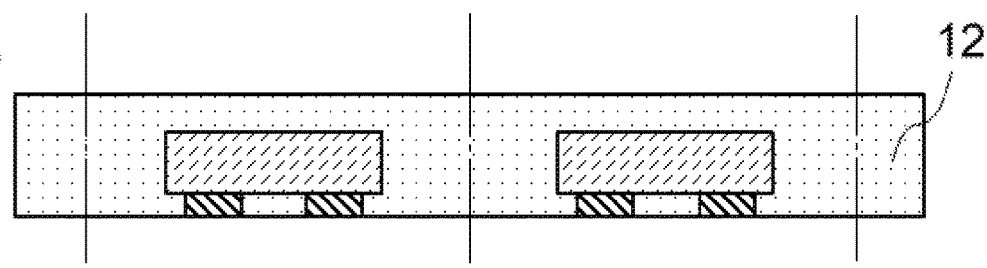
Figure 3E:
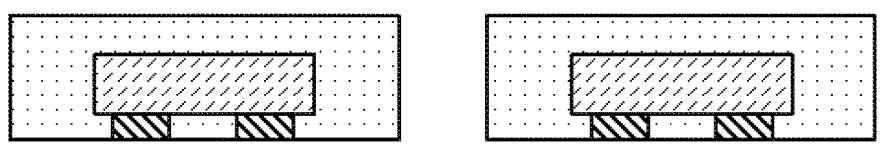

In the case as shown in FIG. 3E, where each of the light emitting devices 20 does not have the substrate, after removing the substrate 11 as shown in FIG. 3A, the sealing member 12 is cut as shown in FIG. 3D to singulate the light emitting devices 20 as shown in FIG. 3E. In such a light emitting devices 20 that does not have the substrate, the electrodes 14 of the light emitting element 14 can be exposed from the sealing member 12 so as to serve as the electrodes of the light emitting device 20. To obtain this configuration, as shown in FIG. 3A, the light emitting elements 14 are preferably mounted on the substrate 11 respectively with the semiconductor layer 14a side facing upward and the electrodes 14b and the substrate 11 are facing each other.

The substrate 11 having a flat plate-like shape as shown in FIG. 3A may not be removed but is used as a constituting component of the light emitting device. In such a case, as shown in FIG. 3B, the sealing member 12 can be disposed to cover all the plurality of light emitting elements 14, then, both the substrate 11 and the sealing member 12 are cut to obtain the individual light emitting devices.

EXAMPLES

Hereinafter, examples according to the embodiments of the present invention will be described in detail. Needless to say, the present invention is not limited only to the examples described below.

Example 1

A method of manufacturing a light emitting device will be described illustrating a side-view type light emitting device having a lateral width of 4.0 mm, a longitudinal width of 3.6 mm, and a thickness of 2.05 mm. FIGS. 2A to 2C illustrate manufacturing steps according to Example 1.

For the particles of a fluorescent material, a KSF-based fluorescent material ($K_2SiF_6$:Mn) having an average particle size of 20 μm is provided. For the first resin solution, a main agent (silicone resin) of the two-component type curable resin is provided. For the second resin solution, a curing agent (silicone resin) of the two-component type curable resin is provided.

For the agitating machine, a centrifugal mixer (Model AR-500 manufactured by Thinky Corporation) equipped with a 500 ml mixing vessel is provided. The first resin solution 50 ml and a KSF-based fluorescent material 50 g (e.g., 50 mass % with respect to the first suspension) are placed in the mixing vessel, and agitated in the centrifugal mixer. Agitation speed is 1000 rpm and agitation time is 3 minutes. The first suspension obtained by the agitation is allowed to stand in the mixing vessel for about 18 hours.

Then, 50 ml of the second resin solution is placed in the mixing vessel containing the first suspension described above, and centrifugal agitation is carried out. Agitation speed is 600 rpm and mixing time is 1 minute.

The second suspension obtained by agitation can be used in situ, but preferably filtered before use. Filtration can be carried out by, for example, using a filter having 212 μm openings and vacuum filtration.

Further, deaeration is preferably performed. For example, a centrifugal vacuum deaeration mixer (Model ARV-310 manufactured by Thinky Corporation) may be used. Agitation is performed at a rotational speed of 600 rpm and an agitation time of 3 minutes. The second suspension thus obtained is filled in the dispenser equipped with a nozzle.

As shown in FIG. 2A, a substrate 11 having a light emitting element 14 mounted thereon is provided. For the light emitting element 14, a light emitting element 14 having a nitride semiconductor layer and a main emission peak wavelength of 445 nm is provided. For the substrate 11, a resin package that includes a substrate 11 having leads 11a and a molded resin member 11b is provided. Note that, in manufacturing, a plurality of resin packages is collectively formed and treated. The leads 11a are respectively a portion of a lead frame that is formed by, for example, patterning a copper plate having a thickness of 0.25 mm, a width of 200 mm and a length of 47 mm into a predetermined shape and applying a plating of silver etc., on the surface thereof. A single lead frame is provided with 40 columns and 8 rows of the molded resin members 11b. Each read package that includes a single molded resin member 11b and corresponding leads corresponds to a single light emitting device.

The resin package defines a recess of 3.4 mm in lateral width, 3.6 mm in longitudinal width, and 0.35 mm in depth. A surface of 1.13 mm in lateral width and 2.215 mm in longitudinal width defines the bottom surface of the recess. A plurality of leads 11a configured to serve positive and negative electrodes are exposed at the bottom surface of the recess and the light emitting element 14 is mounted on the exposed portions of the corresponding leads 11a. The molded resin member 11b defines lateral surfaces of the recess. The molded resin member 11b is exposed between the leads at the bottom surface of the recess.

The leads 11a and the light emitting element 14 are bonded by a bonding member. An upper surface of the light emitting element 14 is provided with p- and n-electrodes. The p- and n-electrodes are respectively electrically connected to corresponding leads 11a via wires 16.

As shown in FIG. 2B, a second suspension 12B is discharged through the nozzle 140, potting over the light emitting element 14 mounted on the substrate 11. Then, the substrate with the plurality of packages is placed in a heating device and heated at 150° C., for 4 hours. Thus, the second suspension 12B in each recess is cured to form the sealing member 12. Subsequently, the substrate is cut to obtain each of a plurality of light emitting devices 10 shown in FIG. 2C.

Variations in chromaticity among 320 light emitting devices 10 obtained from a single substrate were about 20% less in x-values and about 10% less in y-values, compared to that of the light emitting devices obtained by using a suspension provided by mixing the first resin solution and the second resin solution, then the fluorescent material is mixed in the suspension.

The light emitting device according to the present invention can be used for various kinds of light sources, such as illumination light sources, light sources for various kinds of indicators, light sources for automobile use, light sources for displays, back light sources for liquid crystal displays, light sources for sensors, and signals.

It is to be understood that although the present disclosure has been described with regard to preferred embodiments thereof, various other embodiments and variants may occur to those skilled in the art, which are within the scope and spirit of the disclosure, and such other embodiments and variants are intended to be covered by the following claims.

What is claimed is:

1. A method of manufacturing a light emitting device comprising:
   providing particles of a fluorescent material;
   providing a substrate having a light emitting element mounted thereon, the light emitting element including a pair of electrodes;
   providing a first resin solution and a second resin solution that are two components of a two-component type curable resin, the second resin solution containing a curing agent of the two-component type curable resin;
   mixing the particles of the fluorescent material in the first resin solution at a first agitation speed for a first period of time to obtain a first suspension;
   allowing the first suspension to stand;
   mixing the second resin solution with the first suspension at a second agitation speed that is lower than the first agitation speed for a second period of time that is shorter than the first period of time to obtain a second suspension after the allowing of the first suspension to stand;
   applying the second suspension on the light emitting element so that the second suspension covers the light emitting element including a region between the electrodes, and curing the second suspension to obtain a sealing member; and
   cutting the sealing member.

2. The method of manufacturing a light emitting device according to claim 1, wherein the particles of the fluorescent material have an average particle size in a range of 3 µm to 30 µm.

3. The method of manufacturing a light emitting device according to claim 1, wherein the particles of the fluorescent material is mixed in the first resin solution with an amount in a range of 10 mass % to 80 mass % with respect to the first suspension.

4. The method of manufacturing a light emitting device according to claim 1, wherein the fluorescent material is a manganese-activated potassium fluosilicate-based fluorescent material.

5. The method of manufacturing a light emitting device according to claim 4, wherein the particles of the fluorescent material have an average particle size in a range of 3 µm to 30 µm.

6. The method of manufacturing a light emitting device according to claim 5, wherein the particles of the fluorescent material is mixed in the first resin solution with an amount in a range of 10 mass % to 80 mass % with respect to the first suspension.

7. The method of manufacturing a light emitting device according to claim 3, wherein the fluorescent material is a manganese-activated potassium fluosilicate-based fluorescent material.

8. The method of manufacturing a light emitting device according to claim 1, wherein
   the allowing of the first suspension to stand is in a range from 12 hours to 36 hours.

9. The method of manufacturing a light emitting device according to claim 1, wherein
   the providing of the substrate includes providing the substrate having the light emitting element and an additional light emitting element mounted thereon,
   the applying of the second suspension includes applying the second suspension on the light emitting element and the additional light emitting element, and the cutting of the sealing member includes cutting the sealing member between the light emitting element and the additional light emitting element.

\* \* \* \* \*